United States Patent [19]
Norton

[11] Patent Number: 5,432,374
[45] Date of Patent: Jul. 11, 1995

[54] INTEGRATED IR AND MM-WAVE DETECTOR

[75] Inventor: Paul R. Norton, Santa Barbara, Calif.

[73] Assignee: Santa Barbara Research Center, Goleta, Calif.

[21] Appl. No.: 14,938

[22] Filed: Feb. 8, 1993

[51] Int. Cl.[6] .................. H01L 27/14; H01L 31/00
[52] U.S. Cl. .................. 257/442; 257/440; 257/31; 257/21
[58] Field of Search ............. 257/442, 440, 31, 21

[56] References Cited

U.S. PATENT DOCUMENTS

| | | | |
|---|---|---|---|
| H95 | 7/1986 | Shanabrook et al. | 257/21 |
| 3,547,546 | 12/1970 | Schier | 350/162 |
| 4,626,675 | 12/1986 | Gundner et al. | 257/440 |
| 4,667,211 | 5/1987 | Iafrate et al. | 257/21 |
| 4,689,650 | 8/1987 | Dinan | 257/442 |
| 4,994,664 | 2/1991 | Veldkamp | 250/216 |

OTHER PUBLICATIONS

Stelzer, 'Merc Cad Te as an IR Detect . . .' *IEEE Trans Ed*, vol ED-16 No. 10, Oct. 1969, pp. 880-884.
Wengler, 'Low Noise Receive . . .', *SPIE* vol. 598, 1985 pp. 27-29.
Chelluri, 'Molecular Beam Epi of II-VI . . .' *Appl Phys Lttr* 49(24), Dec. 1986, pp. 1665-1667.
"Optical Design with Diffractive Lenses" by D. Falkis and G. M. Morris, Photonics Spectra, Nov. 1991, pp. 205-208.
"Binary Optics", by W. B. Veldkamp and T. J. McHugh, Scientific American, May 1992, pp. 92-97.
"Coherent Addition of AlGaAs Lasers Using Microlenses and Diffractive Coupling" by J. R. Leger et al., Appl. Phys. Lett. 52(21), May 23, 1988, pp. 1771-1772.
"Coherent Laser Beam Addition: An Application of Binary-Optics Technology" by J. R. Leger et al., The Lincoln Laboratory Journal, vol. 1, No. 2, 1988 pp. 225-245.
"A Low Noise Receiver for Submillimeter Astronomy", by M. J. Wengler, D. P. Woody, R. E. Miller, and T. G. Phillips, SPIE, vol. 598, 1985 pp. 27-29.
"A Low Noise Receiver For Millimeter And Submillimeter Wavelengths", M. J. Wengler, D. P. Woody, R. E. Miller, and T. G. Phillips, Intl. Journ. of Infrared and Millimeter Waves, vol. 6, No. 8, 1985, pp. 697-701.

*Primary Examiner*—Ngân V. Ngô
*Assistant Examiner*—Stephen D. Meier
*Attorney, Agent, or Firm*—W. C. Schubert; W. K. Denson-Low

[57] ABSTRACT

An integrated radiation detector (10) includes a substrate (12) having a first region (14) comprised of Group III-V semiconductor material, such as GaAs, formed over a first surface, and a second region (26) comprised of Group II-VI semiconductor material, for example HgCdTe, formed over a second, opposite surface. The second region has a bandgap selected for absorbing radiation within a first range of wavelengths, such as IR radiation within the range of 12 micrometers to three micrometers. A first detector includes an antenna structure (20) coupled to a Schottky contact (22) for detecting electromagnetic radiation having wavelengths within a second range of wavelengths, such as wavelengths corresponding to frequencies within a range of approximately 30 GHz to approximately 1000 GHz. A second detector includes a photoconductive or photovoltaic infrared detector for collecting charge carriers generated by the absorption of the IR radiation. For a substrate comprised of semi-insulating GaAs, a lattice accommodation region (28) is interposed between the substrate and the second region. An RF potential ground plane is disposed, relative to the Schottky contact, at a distance corresponding to ¼ of a wavelength. A microlens (42) may be provided in registration with an underlying IR detector for focussing, through the substrate, incident IR radiation.

21 Claims, 3 Drawing Sheets

INTEGRATED IR AND MM-WAVE DETECTOR

CROSS-REFERENCE TO RELATED PATENT APPLICATION

This patent application is related to commonly assigned U.S. Pat. application Ser. No. 08/003,715, filed Jan. 12, 1993 entitled "Integrated IR/Visible Sensor", by Paul Norton.

FIELD OF THE INVENTION

This invention relates generally to radiation detectors and, in particular, to detectors sensitive to millimeter (mm) wavelength radiation and to detectors sensitive to radiation within the infrared (IR) spectrum.

BACKGROUND OF THE INVENTION

Detectors of mm-wavelength radiation and detectors of IR radiation are both known in the art. One material that is well-suited to fabricating mm-wavelength detectors and associated high-speed amplifier circuitry is a Group III—V material, such as GaAs.

The following articles describe various millimeter and submillimeter receivers: "SIS Receivers for Submillimeter Wave Astronomy", First International Symposium on Space Terahertz Technology, T. G. Philips et al., page 343; "A Low Noise Receiver for Millimeter and Submillimeter Wavelengths", M. J. Wengler et al , International Journal of Infrared and Millimeter Waves, Vol. 6, No. 8, 1985, pages 697–701; and "A Low Noise Receiver for Submillimeter Astronomy", M. J. Wengler et al , SPIE Vol 598, Instrumentation for Submillimeter Spectroscopy, 1985, pages 27–29. The first article listed above shows the use of a spiral antenna and a hyperhemispheric lens, while the second and third articles show a bowtie antenna configuration used in conjunction with a hyperhemispheric lens.

IR detectors may be fabricated from material selected from Group II–VI of the periodic table=, such as $Hg_{(1-x)}Cd_xTe$, wherein x varies within a range of approximately 0.2 for long wavelength IR (LWIR) to a value of approximately 0.4 for short wavelength IR (SWR).

For some applications it may be desirable to provide both mm-wave and IR detectors for simultaneously viewing a scene that include a source of mm-waves and also a source of IR radiation. However, the fabrication of a detector or detectors, from one type of material, that is responsive to both sources of radiation is difficult or impossible to achieve.

It is thus an object of the invention to provide an integrated detector structure that is simultaneously responsive to sub-millimeter or millimeter wavelength radiation and also to IR radiation.

SUMMARY OF THE INVENTION

The foregoing and other problems are overcome and the objects of the invention are realized by an integrated radiation detector and to a method of fabricating same. The integrated radiation detector includes a substrate and a first detector disposed over a first surface of the substrate. The first detector is responsive to electromagnetic radiation having a first wavelength in a range of sub-millimeter wavelengths to millimeter wavelengths. A second detector is disposed over a second surface of the substrate, the second surface being opposite the first surface. The second detector is responsive to electromagnetic radiation having a second wavelength in a range of micrometer wavelengths to greater than ten micrometer wavelengths.

In accordance with a disclosed embodiment of the invention, the integrated radiation detector includes a substrate having a first region comprised of Group III–V semiconductor material, such as GaAs, formed over a first surface of the substrate, and a second region comprised of Group II–VI semiconductor material, for example HgCdTe, formed over a second, opposite surface of the substrate. The second region has a bandgap selected for absorbing radiation within a first range of wavelengths, such as IR radiation within the range of approximately 3 micrometers to approximately 12 micrometers, and generates charge carriers therefrom. A first detector is coupled to a radiation receiving surface of the first region and includes an antenna structure coupled to a Schottky contact or a field effect transistor (FET) for detecting electromagnetic radiation having wavelengths within a second range of wavelengths of approximately 0.3 millimeter to approximately 10 millimeters. These wavelengths correspond to frequencies within a range of approximately 1000 GHz to approximately 30 GHz. A second detector is coupled to the second region and includes a p-n photovoltaic junction, or a photoconductive region, for collecting the charge carriers generated by the absorption of the IR radiation.

For a substrate comprised of Group III-V material, such as semi-insulating GaAs, a lattice-mismatch accommodation region comprised of Group II–VI semiconductor material, such as CdZnTe, is interposed between the substrate and the second region.

An RF potential ground plane is disposed, relative to the Schottky contact or the FET, at a distance corresponding to $\frac{1}{4}$ of a wavelength within the second range of wavelengths.

In a further embodiment of the invention a microlens is fabricated within the first region in registration with the underlying IR detector for focussing, through the substrate, incident electromagnetic radiation within the first range of wavelengths for reception by the IR detector. An external focussing lens may also be provided for focussing both the incident millimeter and IR radiation.

BRIEF DESCRIPTION OF THE DRAWING

The above set forth and other features of the invention are made more apparent in the ensuing Detailed Description of the Invention when read in conjunction with the attached Drawing, wherein.

DETAILED DESCRIPTION OF THE INVENTION

Figure 1:
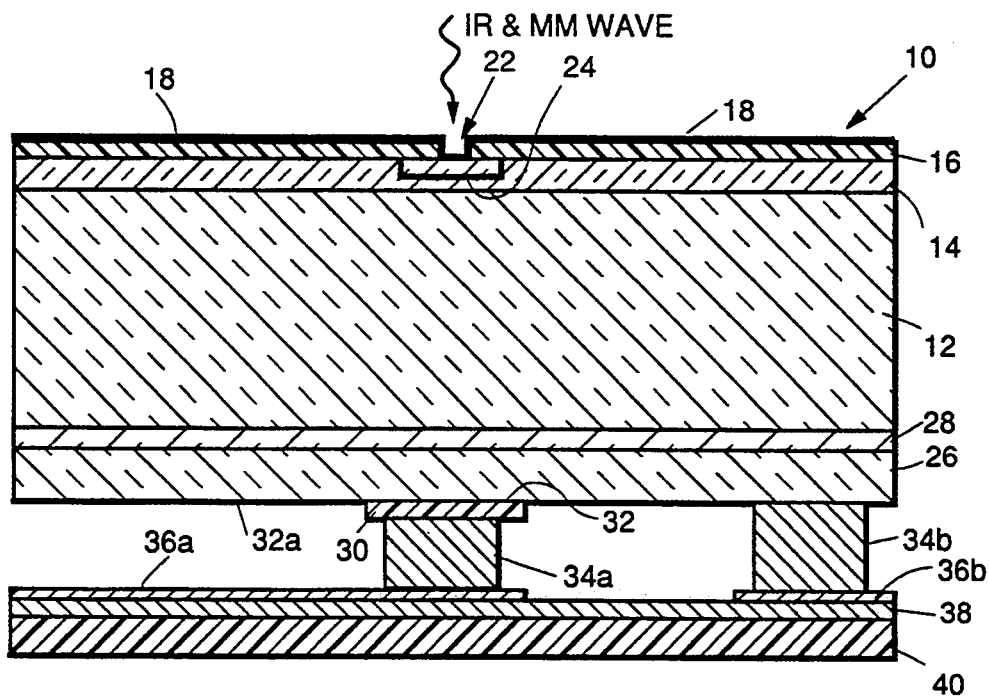
FIG. 1 is a cross-sectional view, taken along the section line 1—1 of FIG. 2 and not drawn to scale, of a first embodiment of an integrated mm-wavelength/IR wavelength radiation detector.
Figure 2:
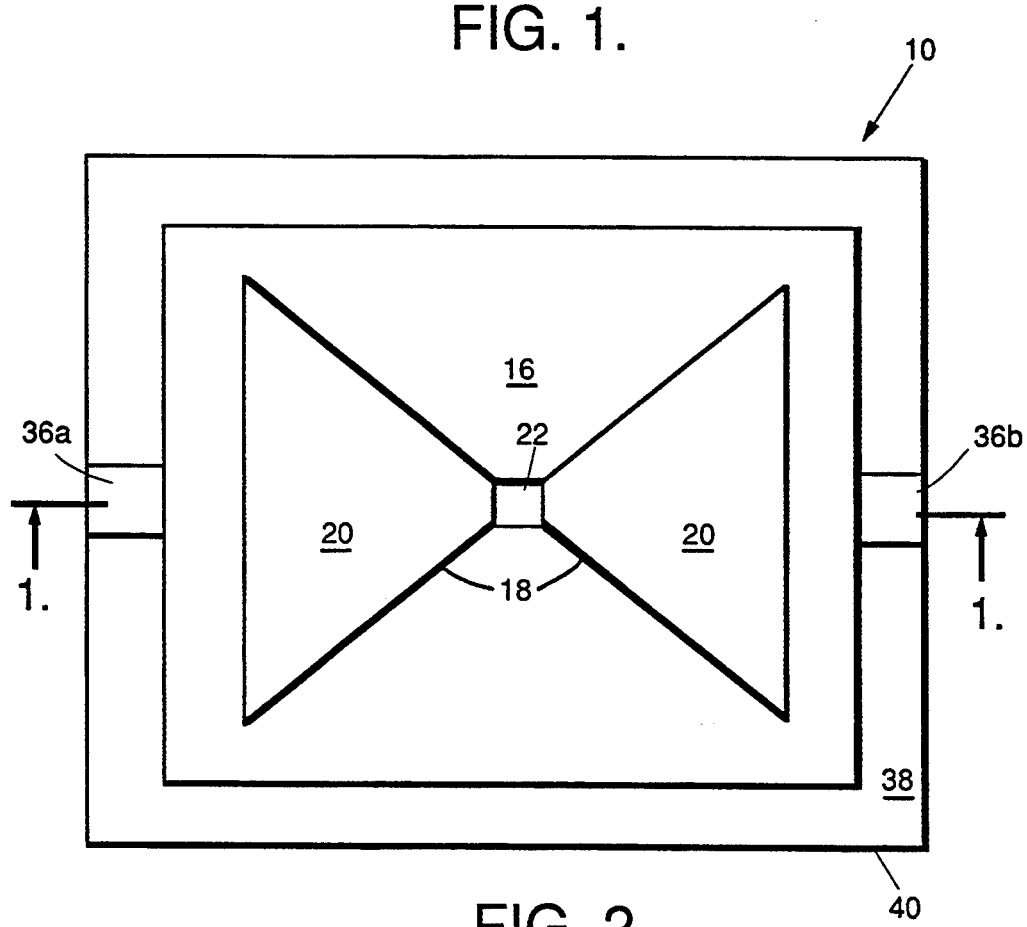
FIG. 2 is a top view, not to scale, of the integrated detector of FIG. 1, the Figure illustrating a first embodiment of an antenna structure.

FIGS. 1 and 2 illustrate a first embodiment of an integrated mm-wavelength and IR radiation detector 10. Hereinafter, the terms millimeter-wavelength and mm-wavelength are intended to encompass both submillimeter wavelengths and millimeter wavelengths within a range of approximately 0.3 mm to approximately 10 mm (30 GHz to 1000 GHz). Detector 10 includes a semi-insulating GaAs substrate 12 having a GaAs epitaxial layer 14 upon a first major surface. The layer 14 is preferably epitaxially grown upon the GaAs substrate 12 through a Liquid Phase Epitaxy (LPE), Molecular Beam Epitaxy (MBE), and/or a Metalorganic Chemical Vapor Deposition (MOCVD) process. An insulating dielectric layer 16 is disposed upon the epitaxial layer 14 and beneath a metallization layer 18. A wirebond (not shown) may be provided for coupling the metallization 18 to external circuitry. The metallization layer 18 also includes a suitable antenna structure 20, such as a "bow tie" configuration, for receiving mm-wavelength radiation of interest.

An aperture within the dielectric layer 16 enables the metallization layer 18 to contact the epitaxial layer 14, thereby forming a Schottky barrier rectifying contact 22. The Schottky contact 22 may be coupled, via the metallization 18, to an external amplifier circuit, or suitable amplifier and/or preamplifier circuitry 24 may be fabricated by known techniques, such as by ion implantation and annealing, within the epitaxial layer 14.

So as to provide an IR detection capability to the detector 10 there is provided upon a second major surface of the GaAs substrate 12 a layer of IR responsive semiconductor material 26, specifically a layer of n-type $Hg_{(1-x)}Cd_xTe$, wherein x may vary within a range of approximately 0.2 for detecting long wavelength IR (LWIR) radiation to a value of approximately 0.4 for detecting short wavelength IR (SWIR) radiation. As employed herein LWIR is considered to have a wavelength of approximately 12 micrometers while SWIR radiation is considered to have a wavelength of approximately three micrometers. The n-type layer 26 may be n-type through the inclusion of residual impurities, or may be intentionally doped with, by example, indium. The layer 26 is preferably epitaxially grown upon the GaAs substrate 12 through LPE, MBE, and/or MOCVD processes. In that the lattice constants of the GaAs substrate 12 and the HgCdTe layer 26 are significantly different, it is preferred to first grow a lattice-mismatch accommodation, or buffer layer 28, upon the GaAs substrate 12, the buffer layer 28 being comprised of, by example, CdTe, CdZnTe, CdTeSe, or CdMgTe. A p+ region 30 is formed by a deposition, diffusion, or implantation process so as to form a p-n photovoltaic junction 32 with the n-type HgCdTe layer 26. By example, the p+ region 30 is comprised of HgCdTe that is doped with arsenic or antimony. A first indium bump 34a couples the p-n junction 32 to a first metal electrode 36a and a second indium bump 34b forms a common contact with the HgCdTe layer 26 and couples same to a common potential electrode 36b. Electrodes 36 are disposed upon an electrically insulating dielectric layer 38 which, in turn, is supported by a substrate 40. A passivation layer 32a comprised of, by example, CdTe, may be applied to the HgCdTe layer 26 for suppressing the generation of surface noise states.

Although only one mm-wavelength detector and one IR detector are shown in FIGS. 1 and 2, it is within the scope of the invention to fabricate a linear array or a two-dimensional array of such detectors. Also, the epitaxial layer 26 may be provided as a p-type layer and the region 30 provided with n-type electrical conductivity.

During operation, the detector 10 is preferably cooled to liquid nitrogen temperature (77 K). Radiation having a mm-wavelength of interest, such as 94 GHz, is received by the antenna structure 20 and is detected by the Schottky contact 22, while IR radiation passes substantially through the regions surrounding the surface metallization, the GaAs epitaxial layer 14, the GaAs substrate 12, and the buffer layer 28. The IR radiation having wavelengths of interest is absorbed within the HgCdTe layer 26, thereby generating charge carriers which are collected, under the influence of a suitable bias potential applied through contacts 34, by the p-n junction 32.

Alternately, the surface metallization of the antenna structure 20, etc., is made thin, and is selected to be substantially transparent to the IR radiation. Suitable conductive materials for this purpose include Ni and $TiO_xN_y$.

In that the growth of the GaAs epitaxial layer 14 requires a temperature in excess of approximately 500° C., this layer is preferably grown on the GaAs substrate 12 early in the fabrication sequence. Any other high temperature processing steps, such as annealing of implanted GaAs regions required to form, by example, the RF preamplifier 24, are also accomplished prior to fabrication of the HgCdTe IR detector. Any low temperature dielectric and metallization deposition steps may be done before or after the IR detector is formed. The performance of the high temperature processing steps prior to the deposition of the HgCdTe insures that the desired stoichiometric ratios are preserved within the HgCdTe material.

The substrate 40 may provide only structural support or, for some embodiments of the invention, may be fabricated from silicon and/or GaAs to include active devices for providing signal amplification, signal multiplexing, etc. for the IR detector 32. Additional indium bumps, not shown, may also be employed to further enhance the mechanical stability of the integrated detector 10.

In that mm-wavelength detectors are typically enclosed within a waveguide housing or a quasi-optical mount, it is preferred to provide the RF detector with a tuned RF ground potential plane located ¼ wavelength from the Schottky diode 22.

For the case where the HgCdTe material of the n-type layer 26 has sufficient electrical conductivity to function as the tuned ground plane, the thickness of the GaAs substrate 12 is selected such that the Schottky contact 22 is located approximately ¼ wavelength from the surface of the HgCdTe layer 26 that is adjacent to the buffer layer 28.

If the HgCdTe conductivity is insufficient to function as the tuned ground plane, the metallization 36a and 36b is fabricated in a ground plane configuration and the thickness of the GaAs substrate 12 is selected such that the Schottky contact 22 is located ¼ of a wavelength from the metallization 36. The dielectric constant of the GaAs substrate 12 is considered when selecting the thickness of the substrate. It is also within the scope of the invention to provide a conductive plane at RF ground potential within the substrate 40, instead of on a surface thereof.

Figure 3:
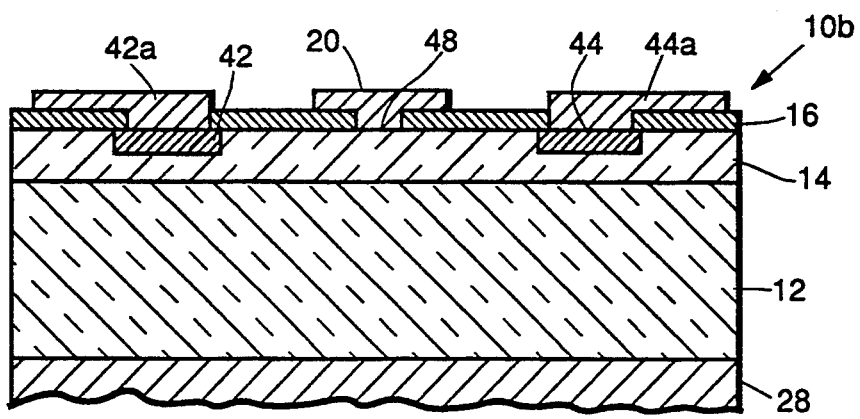
FIG. 3 is a cross-sectional view, taken along the section line 3—3 of FIG. 4 and not drawn to scale, of a second embodiment of an integrated mm-wavelength/IR wavelength radiation detector, the Figure illustrating an FET embodiment of a sub-millimeter or millimeter wavelength detector.
Figure 4:
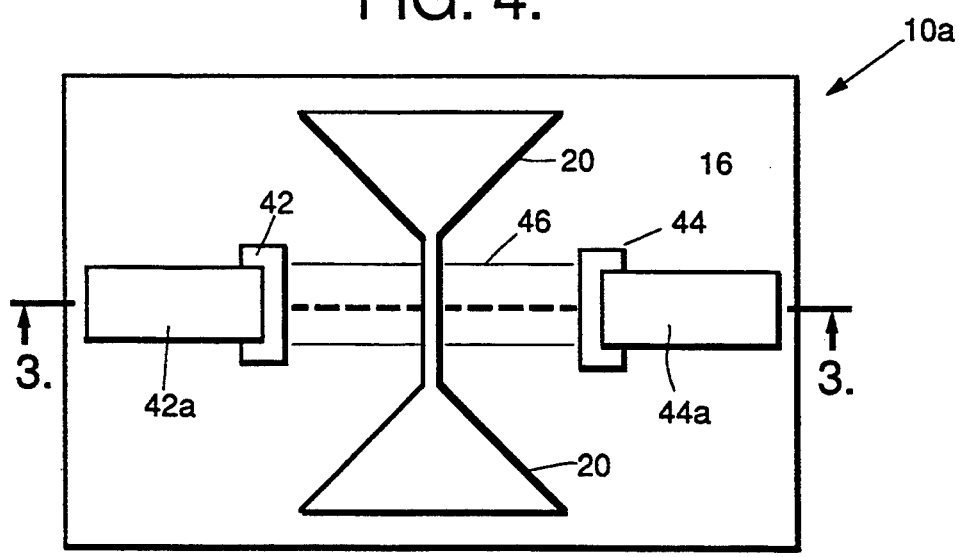
FIG. 4 is a top view, not to scale, of the integrated detector of FIG. 3.

Reference is now made to FIGS. 3 and 4 for showing a further embodiment of the invention. Structures that are found in FIGS. 1 and 2 are numbered accordingly. Specifically, FIGS. 3 and 4 illustrate an FET embodiment of the millimeter wavelength detector portion of an integrated detector 10a.

Figure 7:
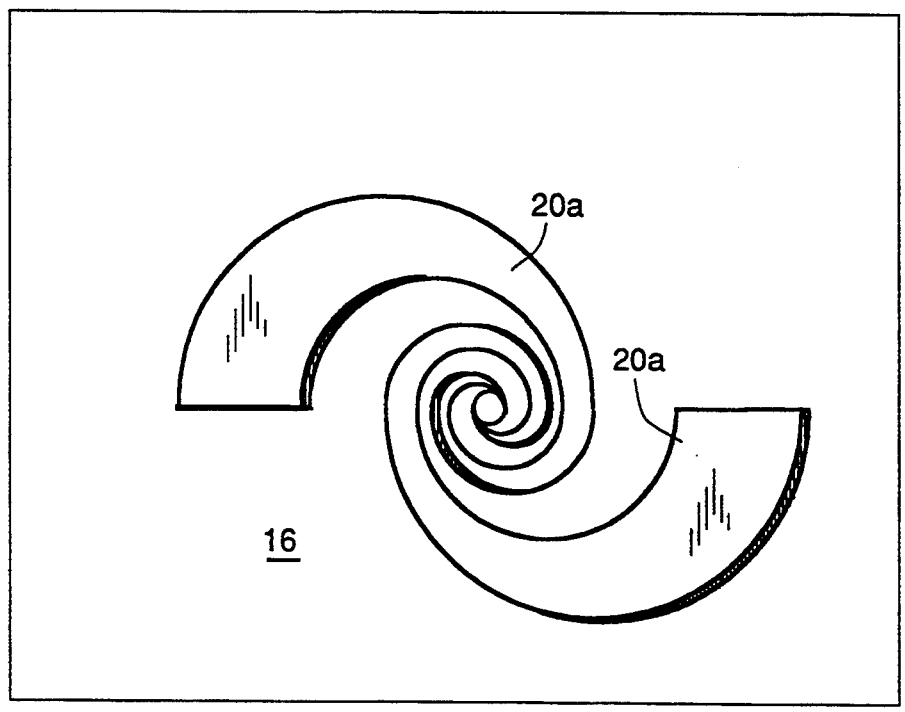
FIG. 7 is a top view of an integrated radiation detector and illustrates a second embodiment of an antenna structure.

A FET active device is fabricated within the GaAs epilayer 14 to include a source 42 and a drain 44, each having an associated contact 42a and 44a. Contacts 42a and 44a may be wirebonded (not shown) to external readout electronics. A gate electrode 48 is disposed over the channel 46 and is electrically coupled to the bowtie antenna structure 20 in the manner shown. In operation, mm-wavelength radiation that is received by the antenna structure 20 causes a modulation of current flow between the source 42 and drain 44. The modulated current flow is amplified and detected by the external readout circuitry. It should be noted that FIGS. 3 and 4 are not drawn to scale, and that the size of the FET active device would be small with respect to the antenna structure 20. FIG. 7 illustrates an alternate embodiment of the antenna structure 20. Specifically, a spiral antenna structure 20a is fabricated, as opposed to the bowtie configuration shown in FIGS. 2 and 4.

Figure 5:
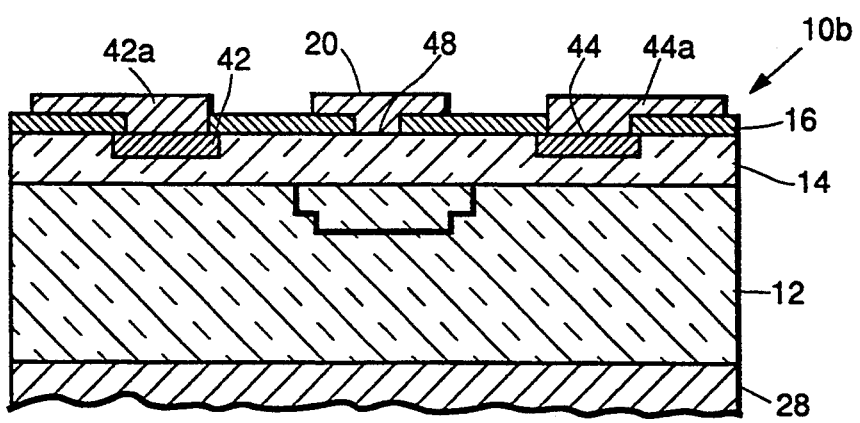
FIG. 5 is a cross-section view, not to scale, of an embodiment of the sub-millimeter or millimeter wavelength detector of FIGS. 3 and 4, this embodiment including an integral IR focussing element.

Referring now to FIG. 5 there is shown a cross-sectional view of a further embodiment of an integrated detector 10b. Those elements of the embodiment of FIG. 5 that are also found in the embodiment of FIGS. 3 and 4 are referenced accordingly.

The embodiment of FIG. 5 includes a microlens 50 that is formed within or near a top surface of the GaAs substrate 12. By example, microlens 50 may be fabricated as a multi-stepped binary lens that approximates a Fresnel zone plate for focussing the incident IR radiation onto the underlying IR detector.

In designing the microlens 50 one consideration is the thickness of the GaAs substrate 12 which, in turn, is a function the value of the mm-wavelength of interest and the manner in which the antenna 20 is tuned to the wavelength of interest. The thickness of the GaAs substrate 12 thus plays an important role in establishing the focal length of the microlens. As was noted above, the thickness of GaAs substrate 12 is partially a function of whether the back surface of the HgCdTe layer 26, or the underlying metallization 36, is employed as the ¼ wavelength tuned ground plane. Another consideration in designing the microlenses 42 is the index of refraction of the GaAs substrate 12, and the changes of index of refraction at the boundaries of the buffer layer 28 and the HgCdTe layer 26.

Although in FIG. 5 the microlens 50 is shown etched down into the GaAs substrate 12, it is also within the scope of the invention to initially grow the epitaxial layer 14 to a greater thickness in a controlled manner over a selected portion of the surface, for example by mass-transport, to form a convex microlens.

The specification and fabrication of such diffractive optical elements within a surface of a substrate is a known technique, and is described in, by example, an article entitled "Optical Design with Diffractive Lenses" by D. Falkis and G. M. Morris, Photonics Spectra, November 1991, pps 205-208, an article entitled "Binary Optics", by W. B. Veldkamp and T. J. McHugh, Scientific American, May 1992, pps. 92-97, an article entitled "Coherent addition of AlGaAs lasers using microlenses and diffractive coupling" by J. R. Leger et al., Appl. Phys. Lett. 52(21), May 23, 1988, pps. 1771-1772, and an article entitled "Coherent Laser Beam Addition: An Application of Binary-Optics Technology" by J. R. Leger et al., The Lincoln Laboratory Journal, Vol. 1, No. 2, 1988 pps. 225-245. Also of interest are, by example, U.S. Pat. No. 3,547,546, issued May 4, 1966, "Multiple Image Forming Device" by H. Schier, U.S. Pat. No. 4,530,736, issued Jul. 23, 1985, "Method for Manufacturing Fresnel Phase Reversal Plate Lenses" by W. E. Mutter, and U.S. Pat. No. 4,994,664, issued Feb. 19, 1991, entitled "Optically Coupled Focal Plane Arrays Using Lenslets and Multiplexers" by W. B. Veldkamp.

Figure 6:
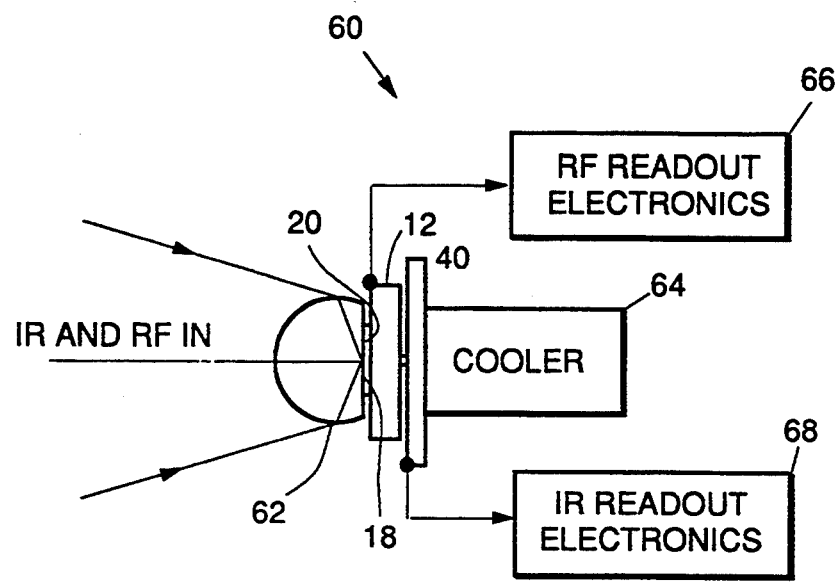
FIG. 6 is a side view, not to scale, of an integrated detector assembly.

FIG. 6 is a side view, not to scale, of an integrated detector assembly 60. A focussing element, such as a hyperhemispheric lens 62, is disposed over the antenna structure 20 or 20a. Lens 62 is comprised of a material that is transparent over the mm-wavelength and the IR-wavelength bands. Suitable materials include, but are not limited to, GaAs, Si, and Ge. The microlens 50 of FIG. 5 is employed to adjust for the difference in focal points between the mm-wavelength radiation and the IR-wavelength radiation, and also to account for the mm-wavelength detector and the IR-wavelength detectors being disposed on opposite sides of the substrate 12.

The assembly 60 also includes a cryogenic cooler 64, RF readout electronics 66, and IR readout electronics 68. The lens 62, integrated detector 10, 10a, or 10b, and the cooler 64 are typically enclosed within a dewar (not shown) that contains a suitably shaped coldshield or warmshield (not shown) for minimizing stray reflections of the received IR radiation.

Based on the foregoing, a method of this invention provides a process for fabricating a radiation detector that is responsive to electromagnetic radiation having wavelengths within two wavelength bands. The method includes the steps of (a) providing a substrate; (b) forming a first epitaxial layer over a first surface of the substrate; (c) forming a dielectric layer over a surface of the first epitaxial layer; (d) fabricating an antenna structure upon the dielectric layer, the antenna structure being coupled with a detector device for detecting at least one wavelength within a first band of wavelengths; and (e) forming a second epitaxial layer over a second surface of the substrate, the second surface being opposite the first surface. The second epitaxial layer is formed to have an energy bandgap for absorbing electromagnetic radiation within a second band of wavelengths.

The step of forming a second epitaxial layer includes an initial step of forming a lattice accommodation region over the second surface of the substrate, such that the step of forming the second epitaxial layer forms the layer upon the lattice accommodation region.

A further step provides an RF potential ground plane that is disposed, relative to the detector device, at a distance corresponding to ¼ of the at least one wavelength. Another step fabricates a lens at or near the first surface of the substrate for focussing, at a point within the second epitaxial layer, incident electromagnetic radiation within the second band of wavelengths.

In summary, this invention provides embodiments of integrated detectors and detector assemblies that are simultaneously responsive to electromagnetic radiation having wavelengths corresponding to frequencies in the band from approximately 30 GHz to approximately 1000 GHz, and also to IR radiation having wavelengths in the band from approximately 12 micrometers to approximately three micrometers. That is, the invention provides an integrated radiation detector that is simultaneously responsive to radiation having wavelengths that differ by approximately three orders of magnitude, such as five millimeters and five micrometers. The teaching of the invention also eliminates a requirement to provide separately packaged detectors, detector housings, sensor apertures, and/or beam splitters.

Although described primarily in the context of a photovoltaic IR detector, it should be realized that the IR detector may instead be a photoconductive type. Furthermore, other material types and dimensions than those explicitly set forth above may be employed in the construction of the various elements of the integrated detector.

By example, the substrate 12 may be comprised of Group IV material, such as Si or Ge, or Group II–VI material, such as CdTe, CdZnTe, CdTeSe, and CdMnTe. One consideration is the transparency of the selected substrate 12 material to IR radiation. For example, InSb blocks IR radiation to approximately 5.5 micrometers, at 77 K, but will efficiently pass LWIR.

The buffer layer 28, if comprised of CdTe, has a thickness of approximately nine micrometers, while the HgCdTe radiation absorbing layer 26 has a typical thickness of approximately 10 micrometers. As was previously stated, the buffer layer 28 may also be comprised of, by example, CdZnTe, CdTeSe, or CdMgTe. In general, any suitable Group II–VI material that functions as an electrical insulator and that is also suitable for lattice accommodating the detector layer 26 to the substrate 12 may be employed for the buffer layer 28.

Thus, while the invention has been particularly shown and described with respect to preferred embodiments thereof, it will be understood by those skilled in the art that changes in form and details may be made therein without departing from the scope and spirit of the invention.

What is claimed is:

1. An integrated radiation detector, comprising:
  a substrate having a first layer of semiconductor material disposed over a first, radiation receiving, surface and a second layer of semiconductor material disposed over a second surface;
  a first detector disposed over said first, radiation receiving surface of said substrate, said first detector being electrically coupled to said first layer of semiconductor material and responsive to electromagnetic radiation having a first wavelength within a range of sub-millimeter wavelengths to millimeter wavelengths; and
  a second detector disposed over said second surface of said substrate, said second surface being opposite said first surface, said second detector being electrically coupled to said second layer of semiconductor material and responsive to electromagnetic radiation having a second wavelength within a range of micrometer wavelengths to greater than ten micrometer wavelengths.

2. An integrated radiation detector as set forth in claim 1 wherein said first layer of semiconductor material is comprised of Group III–V semiconductor material, and wherein said second layer of semiconductor material is comprised of Group II–VI semiconductor material.

3. An integrated radiation detector as set forth in claim 2 wherein said substrate is comprised of Group III–V material and is substantially transparent to said second wavelength.

4. An integrated radiation detector as set forth in claim 1 wherein said second layer of semiconductor material is selected for absorbing infrared (IR) radiation for generating detectable charge carriers therefrom; and further including a buffer layer interposed between said second layer of semiconductor material and said substrate for accommodating a difference between a lattice constant of the semiconductor material of said substrate and a lattice constant of the semiconductor material of said second layer.

5. An integrated radiation detector as set forth in claim 1 wherein said first detector includes an electrically conductive antenna structure coupled to a Schottky diode, and wherein said Schottky diode is comprised of a portion of said first layer of semiconductor material.

6. An integrated radiation detector as set forth in claim 1 wherein said first detector includes an electrically conductive antenna structure coupled to a terminal of a field-effect transistor, and wherein said field-effect transistor is comprised of a portion of said first layer of semiconductor material.

7. An integrated radiation detector as set forth in claim 1 and further including an RF potential ground plane that is disposed, relative to said first detector, at a distance corresponding to ¼ of the first wavelength and in a direction towards said second surface of said substrate.

8. An integrated radiation detector as set forth in claim 1 and further including lens means for focussing incident IR radiation through said substrate for reception by said second detector.

9. An integrated radiation detector, comprising:
  a substrate having a first region comprised of Group III–V semiconductor material formed over a first, radiation receiving, surface of said substrate and a second region comprised of Group II–VI semiconductor material formed over a second surface of said substrate, said first surface being opposite said second surface, said second region having a bandgap selected for absorbing radiation within a first range of wavelengths for generating charge carriers therefrom;
  a first detector coupled to a radiation receiving surface of the first region and including an antenna structure coupled to a detector means for detecting electromagnetic radiation having wavelengths within a second range of wavelengths, wherein wavelengths within the second range of wavelengths are longer than wavelengths within the first range of wavelengths; and
  a second detector coupled to the second region for collecting the charge carriers.

10. An integrated radiation detector as set forth in claim 9 wherein said substrate is comprised of Group III–V semiconductor material, and further including a lattice accommodation region comprised of Group II–VI semiconductor material, said lattice accommodation region being interposed between said substrate and said second region.

11. An integrated radiation detector as set forth in claim 9 wherein said first range of wavelengths is approximately 3 micrometers to approximately 12 micrometers, and wherein said second range of wavelengths corresponds to frequencies in a range of approximately 30 GHz to approximately 1000 GHz.

12. An integrated radiation detector as set forth in claim 9 and further including an RF potential ground plane that is disposed, relative to said detector means, at a distance corresponding to ¼ of a wavelength within said second range of wavelengths and in a direction towards said second surface of said substrate.

13. An integrated radiation detector as set forth in claim 12 wherein said RF potential ground plane includes at least a portion of said second region.

14. An integrated radiation detector as set forth in claim 12 wherein said RF potential ground plane includes an electrically conductive plane that is disposed upon or within a second substrate that underlies said second region.

15. An integrated radiation detector as set forth in claim 9 and further including lens means for focussing, through said substrate, incident electromagnetic radiation within the first range of wavelengths.

16. An integrated radiation detector as set forth in claim 9 and further including lens means, disposed over said antenna structure, for focussing incident electromagnetic radiation, within the first range of wavelengths and within the second range of wavelengths, at or near said radiation receiving surface.

17. An integrated radiation detector, comprising:
a substrate having a first layer comprised of Group III-V semiconductor material formed over a first, radiation receiving, surface of said substrate and a second layer comprised of Group II-VI semiconductor material formed over a second surface of said substrate, said first surface being opposite said second surface, said second layer having a bandgap selected for absorbing electromagnetic radiation having wavelengths within a first range of wavelengths for generating charge carriers therefrom;
a first detector coupled to said second layer for collecting the charge carriers;
a second detector coupled to a radiation receiving surface of said first layer and comprising an antenna structure electrically coupled to a detector means that is formed at least partially from a portion of said first layer for detecting electromagnetic radiation having wavelengths within a second range of wavelengths, said antenna structure being coplanar with and electrically insulated from said radiation receiving surface of said first layer; and
an RF potential ground plane means that is disposed, relative to said detector means, at a distance corresponding to approximately ¼ of a wavelength within said second range of wavelengths and in a direction towards said second surface of said substrate;
wherein said first range of wavelengths includes wavelengths between approximately 3 micrometers to approximately 12 micrometers, and wherein said second range of wavelengths includes wavelengths that correspond to frequencies in a range of approximately 30 GHz to approximately 1000 GHz.

18. An integrated radiation detector as set forth in claim 17 wherein said substrate is comprised of Group III-V semiconductor material, and further including a lattice accommodation region interposed between said substrate and said second layer of semiconductor material.

19. An integrated radiation detector as set forth in claim 17 wherein said RF potential ground plane means includes at least a portion of said second layer.

20. An integrated radiation detector as set forth in claim 17 wherein said RF potential ground plane means includes an electrically conductive plane that is disposed upon or within a second substrate that underlies said second layer, and wherein said second substrate has formed thereon at least one readout circuit that is electrically coupled to said first detector.

21. An integrated radiation detector as set forth in claim 17 and further including lens means disposed for focussing, through said substrate, incident electromagnetic radiation having a wavelength within the first range of wavelengths.

* * * * *